United States Patent
Brandl

(10) Patent No.: US 7,723,198 B2
(45) Date of Patent: May 25, 2010

(54) INTEGRATED SEMICONDUCTOR CASCODE CIRCUIT FOR HIGH-FREQUENCY APPLICATIONS

(75) Inventor: Peter Brandl, Villach (AT)

(73) Assignee: Atmel Automotive GmbH, Heilbronn (DE)

( * ) Notice: Subject to any disclaimer, the term of this patent is extended or adjusted under 35 U.S.C. 154(b) by 546 days.

(21) Appl. No.: 11/717,659

(22) Filed: Mar. 14, 2007

(65) Prior Publication Data

US 2007/0166940 A1 Jul. 19, 2007

Related U.S. Application Data

(63) Continuation of application No. PCT/EP2005/009810, filed on Sep. 13, 2005.

(30) Foreign Application Priority Data

Sep. 14, 2004 (DE) ........................ 10 2004 044 835

(51) Int. Cl.
*H01L 21/331* (2006.01)
*H01L 29/40* (2006.01)
(52) U.S. Cl. ...................................... 438/317; 257/198
(58) Field of Classification Search ................. 438/309, 438/312, 317; 257/197–198; *H01L 21/331, H01L 21/8222*
See application file for complete search history.

(56) References Cited

U.S. PATENT DOCUMENTS

| 5,073,810 | A | * | 12/1991 | Owada et al. ............... 257/588 |
| 5,175,603 | A |   | 12/1992 | Hamasaki |
| 5,399,899 | A | * | 3/1995  | Dekker et al. ............... 257/566 |
| 6,479,844 | B2 | * | 11/2002 | Taylor ......................... 257/192 |
| 7,556,976 | B2 | * | 7/2009  | Taylor et al. ................... 438/46 |

FOREIGN PATENT DOCUMENTS

| DE | 39 01 881 A1 | 8/1989 |
| EP | 0 493 854 A1 | 7/1992 |

* cited by examiner

*Primary Examiner*—Kiesha R Bryant
*Assistant Examiner*—John Doyle
(74) *Attorney, Agent, or Firm*—Muncy, Geissler, Olds & Lowe, PLLC

(57) ABSTRACT

An integrated semiconductor cascode circuit is provided that comprises an emitter layer, a first base area, a second base area, an intermediate area and a collector area. The first base area is arranged between the emitter layer and the intermediate area, and the second base area is arranged between the intermediate area and the collector area. A dielectric layer that is provided with a central opening is arranged between the first base area and the second base area. The invention also relates to a method for the production of said semiconductor cascode circuit.

11 Claims, 2 Drawing Sheets

INTEGRATED SEMICONDUCTOR CASCODE CIRCUIT FOR HIGH-FREQUENCY APPLICATIONS

This nonprovisional application is a continuation of International Application PCT/EP2005/009810, which was filed on Sep. 13, 2005, and which claims priority to German Patent Application No. DE 102004044835, which was filed in Germany on Sep. 14, 2004, and which are both herein incorporated by reference.

BACKGROUND OF THE INVENTION

1. Field of the Invention

The present invention relates to an integrated semiconductor cascode circuit with an emitter layer, a first base region, a second base region, an intermediate region, and a collector region. The first base region is located between the emitter layer and the intermediate region, and the second base region is located between the intermediate region and the collector region. The invention also further relates to a method for producing an integrated semiconductor cascode circuit.

2. Description of the Background Art

From U.S. Pat. No. 5,399,899 semiconductor cascode circuits with mesa structures of multiple layers are known. The structure of each layer stack in the mesa structures represents a cascode comprised of two transistors. Base terminals of the upper transistor lie in a plane with the emitter terminal of a mesa structure. Example applications for such cascodes are not given in U.S. Pat. No. 5,399,899. According to the disclosure in U.S. Pat. No. 5,399,899, the height of the specified stack of layers from the bottom collector layer to the top layer, which contains base terminals of the upper transistor and the emitter terminal, is 2800 nm.

A structure with such dimensions is not typically suitable for high-frequency applications with frequencies up to approximately 200 GHz, since the cutoff frequency is determined by the length of time for the charge carriers to traverse such layer stacks between the emitter and collector terminal. Layer stack thicknesses on the order of, e.g., less than 100 nm appear to be significantly more suitable for the specified frequencies. In principle, a reduction in the layer thickness results in a higher cutoff frequency due to the shorter distance that must be traveled by the charge carriers. However, a disadvantage is that the desired high breakdown voltage also decreases with decreasing layer thickness.

When reducing the layer thicknesses of a semiconductor cascode circuit of the aforementioned type, it is necessary to ensure, in particular, that the base regions of the semiconductor cascode circuit, whose layer thickness may be only a few nm, are connected in a low-resistance fashion to external, generally metallic, contacts. Conceptually, the base layers can be divided into inner regions and outer regions. The inner region is defined by the lateral extension of the pn junctions toward the adjacent emitter and collector layers, and the outer region is used to connect to the aforementioned metallic contacts. It is the outer regions of the base layers that generally dominate the connection resistance, which is to say the total resistance between the metal and inner base.

In order to minimize the connection resistance, so-called "link" implantations of dopants are known, which increase the conductivity in the region of the outer base and in the semiconductor region between the external contact and the base region. Instead of implanting the dopants, it is also possible to introduce them by diffusion processes.

The diffusion or implantation of dopants generally results in doped regions which, in contrast to the rather planar base regions, also have a non-negligible smearing in their vertical extent, with the doped regions usually extending beyond the base layer plane. Such terminal dopants adversely affect the capacitances and breakdown voltages between the base regions. Small capacitances and high breakdown voltages are desired.

SUMMARY OF THE INVENTION

It is therefore an object of the present invention to provide a semiconductor cascode circuit and a method for producing a semiconductor cascode circuit with base terminal dopings, wherein the increase in capacitance and reduction in breakdown voltage which result from the terminal dopants are each minimized.

This object is attained in an integrated semiconductor cascode circuit in that a dielectric layer provided with a central opening is arranged between a first base region and a second base region.

In addition, this object is attained in a method of the aforementioned type comprising the following steps: defining at least one dielectrically delimited active collector region in a semiconductor substrate; producing, on the collector region, a sequence of layers comprising the second base region and a second subregion of the intermediate region; producing, on the second subregion, a dielectric layer with a central opening and an outer edge; producing, on the dielectric layer and on an exposed second subregion within the central opening and outside the outer edge, a sequence of layers comprising a first subregion of the intermediate layer and the first base region; producing the emitter layer on the first base region; etching a mesa structure with a first cross-section with the aid of a first mask, a second mask resting on the first mask offset to one side, and a third mask defined by the outer edge of the dielectric layer, wherein the etching removes material located above dielectric regions; and raising a dopant concentration in a first terminal region and in a second terminal region.

In this context, the step of producing the sequence of layers on the collector region is not to be understood to mean that the layer sequence is necessarily created selectively only on the collector region and not on adjacent regions. Rather, the layer sequence is preferably initially created nonselectively on the collector region and on adjacent regions.

As a result of the dielectric layer provided with a central opening, the depth to which a terminal implantation for the first base layer takes place can be limited to a precisely determined penetration depth. Moreover, the terminal implantation that takes place to this penetration depth can be performed with an increased dopant concentration without this being associated with a greater penetration depth. Undesirable dopants in the intermediate region, which would otherwise increase the capacitance and lower the breakdown voltage, are avoided through the limited penetration depth. As a result of the invention, breakdown voltages on the order of 2 to 5 volts can be achieved even with stack heights that are less than the 30 nm suitable for high-frequency applications, for example, so that adequate signal amplitudes are possible even at high frequencies up to approximately 200 GHz. To a certain degree, this effect results from the combination of features from each one of the independent claims, thus in particular from a semiconductor cascode circuit with a dielectric layer between the two bases of the cascode. By contrast, the breakdown voltage drops to levels below 2 volts in conventional high-frequency cascode circuits having base terminal implantations without such a dielectric layer.

The emitter layer, the first base region, a first subregion of the intermediate region, the dielectric layer, a second part of the intermediate region, and the second base region to be arranged vertically above one another as a layer stack with a mesa structure.

Mesa structures are simple to produce by nonselective creation of layer stacks and subsequent structuring lithography and etching steps.

Another embodiment provides that the vertical extent of a layer stack including an emitter layer, first base region, intermediate region, dielectric layer, and second base region, is less than 30 nm.

At such values of the vertical extent, the time that the charge carriers require to traverse the cascode profile is so short that high switching speeds of up to approximately 200 GHz can be realized.

A terminal of the first base region can be located on a first side of the layer stack and a terminal of the second base region can be located on a second side of the layer stack.

Such a laterally offset arrangement of the base terminals is characterized by a desirable low interaction between the (outer) base terminals and by simple manufacturability using lithography, etching, and contacting steps.

Another embodiment has a first terminal region for electrical connection of the first base region, and has a second terminal region for electrical connection of the second base region, wherein the first terminal region and the second terminal region are characterized by an increased dopant concentration as compared to adjacent material of the emitter layer.

The increased dopant concentration in the specified terminal regions results in a desirable low base terminal resistance with ohmic characteristics between each (inner) base layer and its associated outer, generally metallic, contact, through the so-called outer base. In this context, the inner base is defined by the area of the pn junction, and the outer base is understood to mean the conductive connection to the outer contacts.

Furthermore, at least one of the two base regions can contain SiGe.

SiGe has a different band gap from Si. As a result, the potential barrier for holes is higher than for electrons. As a desirable consequence, a thyristor effect, which is to say through-conduction ("triggering") of the mesa structure is avoided.

Another embodiment provides that the dielectric layer can be made of oxide and/or nitride.

Oxides and/or nitrides allow active regions to be insulated from one another in a permanent manner. Moreover, oxides and nitrides can be removed selectively with respect to one another and with respect to active semiconductor regions by selective etching steps, which simplifies structuring through lithography, masking, and etching steps.

The first base region and/or the second base region to be produced as SiGe layers, and for the emitter layer, the intermediate region, and the collector region to be produced as Si layers.

In this embodiment of the production process, the same advantages result for the end product as those already described above in conjunction with an embodiment of a semiconductor cascode (e.g., avoidance of a thyristor effect).

In another embodiment, the second base region, the intermediate region, the first base region, and the emitter layer can be produced by epitaxial growth.

Firstly, this method for producing the regions has the advantage that a monocrystalline structure of a substrate layer continues uninterrupted through all grown regions. An additional advantage is that the desired vertical dopant profile can be set during growth, so that successive regions with different doping can be produced together in one epitaxy step.

A definition of dielectrically delimited active collector regions within a semiconductor substrate can take place through flat oxide-filled trenches.

The STI technique typically used to produce such trenches has the advantage of smaller structure widths and thus greater packing densities than other techniques for producing dielectric structures, for example the LOCOS technique (LOCOS=local oxidation of silicon).

Another embodiment is distinguished in that the dielectric region can be produced by forming an oxide layer, and the etching of the mesa structure takes place through a dry etching step that is selective to oxide.

As a result of this embodiment, the dielectric region is used multiple times, since on the one hand it produces the desired properties (reduced capacitance, increased breakdown voltage) in later operation of the cascode, and on the other hand acts as an etch stop during production, which simplifies production.

It is a matter of course that the features mentioned above and those explained below can be used not only in the combinations specifically stated, but also alone or in other combinations, without departing from the scope of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
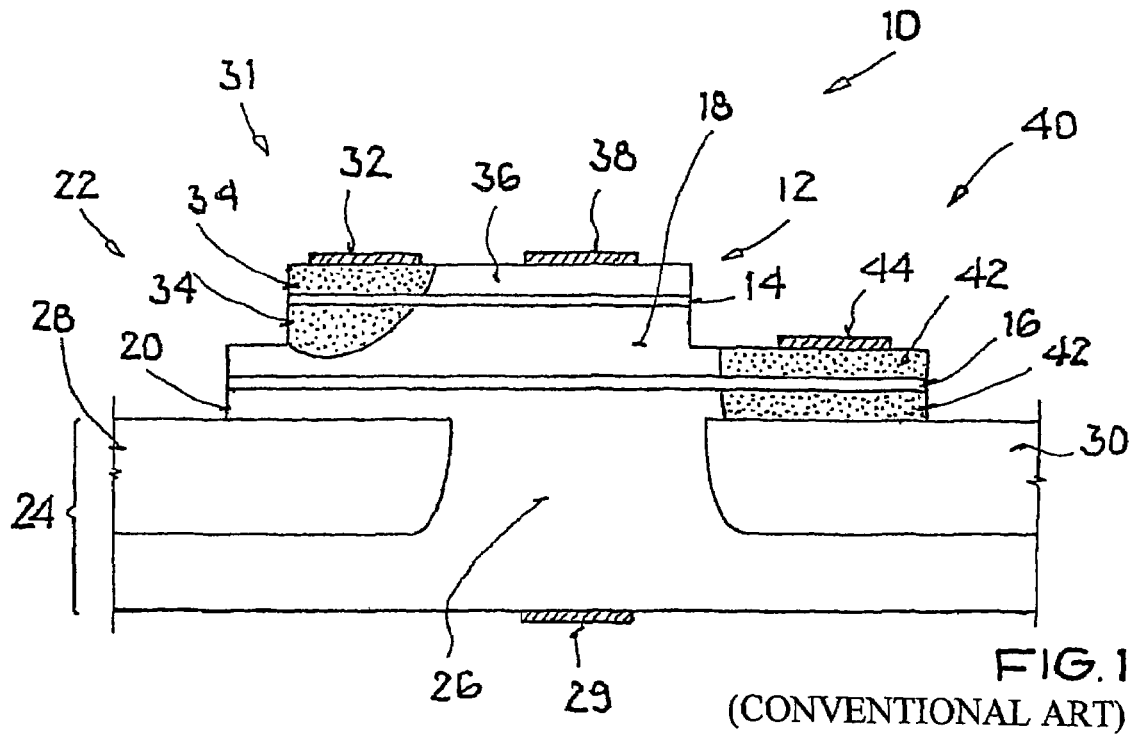
FIG. 1 illustrates a conventional semiconductor cascode.

In the following description of the figures, like numbers identify like objects. FIG. 1 shows a conventional vertically integrated semiconductor cascode circuit 10 with an emitter layer 12, a first base region 14, a second base region 16, an intermediate region 18, and an active collector region 26. The first base region 14 is located between the emitter layer 12 and the intermediate region 18, and the second base region 16 is located between the intermediate region 18 and the collector region 26. A thin layer 20 preferably is made of the semiconductor material of the collector region 26. It can be produced through an epitaxy step, for example, in which the monocrystalline structure of the active collector region 26 continues upward, so that this part of the layer 20 is included as part of the collector region 26. The layer 20 is applied primarily for manufacturing reasons, and in a certain sense forms a base for deposition of the second base region 16. It is not essential to the cascode's functionality, and thus can also be omitted if necessary. The regions 18, 16, 14 and the emitter layer 12 are arranged as a layer stack 22 in the form of a mesa structure on a semiconductor substrate 24. The semiconductor substrate 24 has the active collector region 26, which is delimited at each side by a trench 28, 30 that is filled with dielectric. Consequently, the layer 20 grows in a polycrystalline manner over the trenches 28, 30.

An electrical connection to the active collector region 26 results from a low-resistance collector contact. The first base region 14 is connected from a first side 31 of the layer stack 22. In FIG. 1, the first side 31 is the left side of the layer stack. A first low-resistance base contact 32 at the surface of the emitter layer 12 serves as the electrical terminal. A first terminal region 34 connects the first base contact 32 to the first base region 14. The first terminal region 34 is produced through implantation or diffusion of dopant atoms having the same conductivity type as the first base layer. A remainder 36 of the emitter layer 12 thus has the opposite conductivity type, so that an insulating pn junction forms between the remainder 36 of the emitter layer 12 and the first terminal region 24. The remainder 36 of the emitter layer 12 serving as emitter is connected by a low-resistance emitter contact 38.

The second base region 16 is connected by a second side 40 of the layer stack 22, which is on the right side in FIG. 1. A second terminal region 42 connects a second high-conductivity base contact 44 to the first base region 16. In a manner analogous to the creation of the first terminal region 34, the second terminal region 42 is created by an implantation or diffusion of dopant atoms that are of the same conductivity type as the first base layer.

The terminal regions 34, 42 each belong to the outer base, while the inner regions of the base regions 14 and 16 are designed with an approximate width that is delimited below the second base region 16 by the spacing of the dielectric-filled trenches 28, 30 on the outside, and is delimited above the first base region 14 by the width of the emitter contact 38 on the inside.

As already described above, in contrast to the rather planar base regions 14, 16, the doped terminal regions 34 and 42 also have a certain vertical extent that extends beyond the respective planes of the base regions 14, 16. In FIG. 1 the first terminal region 34, in particular, extends far into the intermediate region 18, which adversely effects the capacitances and breakdown voltages between the base regions 14, 16.

Figure 2:
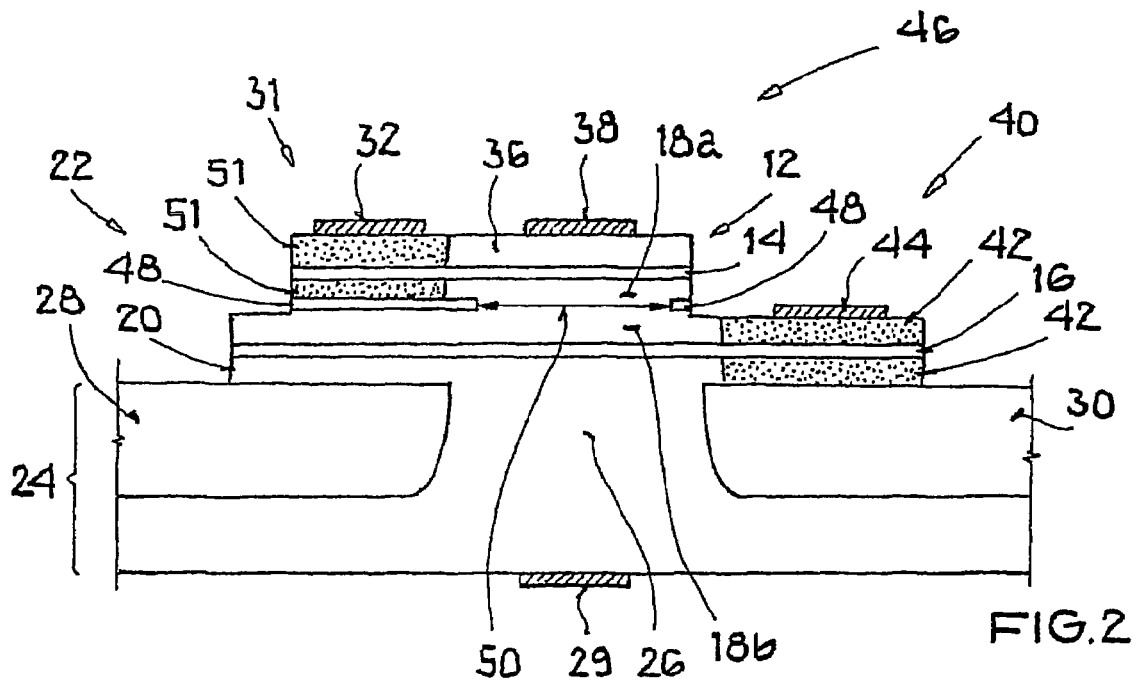
FIG. 2 illustrates an exemplary embodiment of a semiconductor cascode.

In contrast, FIG. 2 shows an exemplary embodiment of an inventive vertically integrated semiconductor cascode circuit 46, which does not exhibit these disadvantages. Unlike FIG. 1, the semiconductor cascode circuit 46 shown in FIG. 2 has an additional dielectric layer 48, which is located between the first base region 14 and the second base region 16, and which has a central opening 50. The dielectric layer 48, which is made, for example, of an oxide or nitride of the semiconductor material of the intermediate region 18, limits the penetration depth of the terminal doping of a first terminal region 51, which connects the first base region 14 to the first base contact 32. Consequently, a very precisely reproducible penetration depth of the dopant atoms results during the production of the semiconductor cascode circuit 46, in which the penetration depth is not dependent on the dopant concentration.

The emitter layer 12, the first base region 14, a first subregion 18a of the intermediate region 18 from FIG. 1, the dielectric layer 48, a second subregion 18b of the intermediate region 18, and the second base region 16 are arranged vertically above one another as a layer stack 22 with a mesa structure. In this context, the vertical extent of the layer stack 22 comprising of emitter layer 12, first base region 14, first subregion 18a of the intermediate region 18, dielectric layer 48, second subregion 18b of the intermediate region 18, and second base region 16, is less than 30 nm. As in the case of the subject of FIG. 1, the semiconductor cascode circuit 46 in FIG. 2 also has a terminal of the first base region 14 on a first side 31 of the mesa structure, and a terminal of the second base region 16 is located on a second side 40 of the mesa structure, wherein the first terminal region 51 electrically connects the first base region 14, and the second terminal region 42 electrically connects the second base region 16. The first terminal region 51 and the second terminal region 42 are distinguished by a higher dopant concentration than the adjacent material of the remainder 36 of the emitter layer 12 and by an opposite conductivity type. As already mentioned above, at least one of the two base regions 14, 16 contains SiGe.

Figure 3:
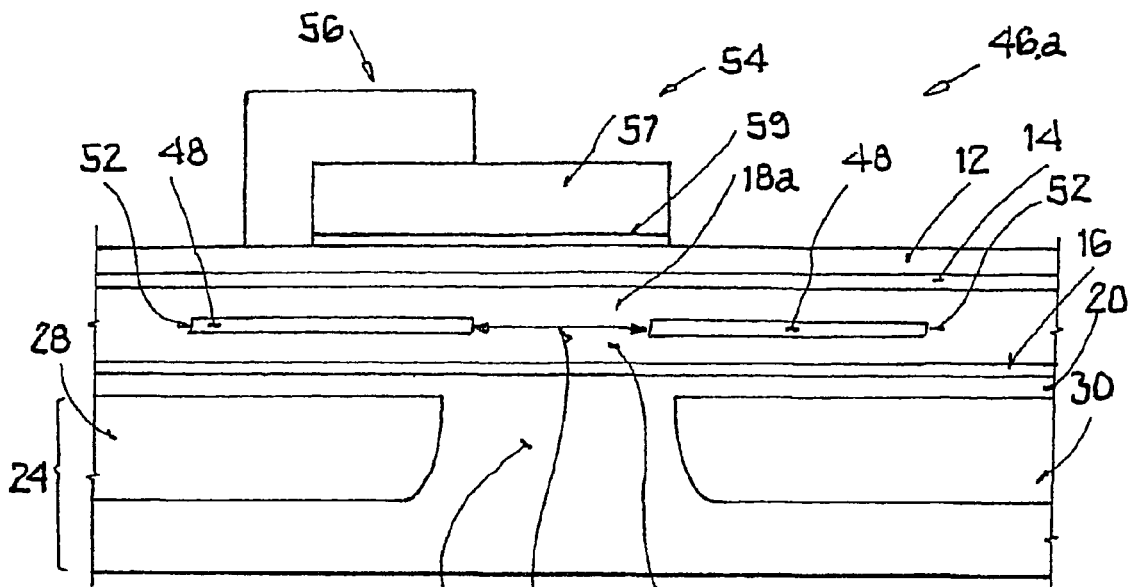
FIG. 3 illustrates an intermediate product of a semiconductor cascode after the first steps of an exemplary embodiment of a manufacturing process following the creation of two masks.

FIG. 3 shows an intermediate product 46.a of a semiconductor cascode 46 after the first steps of an example embodiment of the inventive production method. The method starts with a semiconductor substrate 24 with a dielectrically delimited active collector region 26. The dielectric boundaries are created as oxide-filled trenches 28, 30 with the STI technique, for example. Following a chemical/mechanical planarization, a first epitaxy step creates on the semiconductor substrate 24, and in particular on the active collector region 26 first a layer 20, if applicable, of the semiconductor material of the collector, and then on top of that a layer sequence comprising the second base region 16 and the second subregion 18b of the intermediate region 18. By changing the addition of a dopant during the epitaxial layer growth, opposite conductivity types can be created in a single epitaxy step in the layer 20 and the intermediate region 18 on the one side, and in the second base region 16 on the other side.

Next, the dielectric layer 48 with the central opening 50 and outer edges 52 is created on the surface of the second subregion 18b of the intermediate region 18. The dielectric layer has, for example, an oxide or a nitride of the semiconductor material of the subregion 18b of the intermediate region 18. The dielectric layer 48 is initially created nonselectively, thus without a mask, on the entire surface of the subregion 18b of the intermediate region 18, for example. After the creation of the dielectric layer 48, the second subregion 18b of the intermediate region 18 is exposed within the central opening 50 and outside the outer edges 52 of the dielectric layer 48 by masking and etching steps. Alternatively, the dielectric layer 48 can also be selectively produced only outside the outer edges 52 and within the central opening 50 by a masking step. In both alternatives, a layer sequence comprising a first subregion 18a of the intermediate region 18 and the first base region 14, and the emitter layer 12 on the first base region 14, are produced on the dielectric layer 48 and on the exposed or newly exposed second subregion 18b by a second epitaxy step.

In the epitaxy steps, the first base region 14 and/or the second base region 16 is produced, for example as an SiGe layer, and the emitter layer 12, intermediate region 18, and layer 20 are each produced as Si layers.

The formation of a first mask 54 and a second mask 56, resting offset on the first mask 54, takes place through conventional lithography and etching steps. The first mask 54 can be, for example, a hard mask of nitride 57 on an oxide layer 59, while the second mask 56 is preferably implemented as a lacquer mask. A dry etching step that is selective to oxide and nitride, in which nonoxidized semiconductor material is preferentially removed, follows the formation of the masks 54, 56. As a result of the dry etching step, a mesa structure having a first cross-section is etched by means of the first mask 54, the second mask 56 resting offset on the first mask 54, and a third mask defined by the outer edge 52 of the dielectric layer 48, wherein the etching removes material located above dielectric regions.

Figure 4:
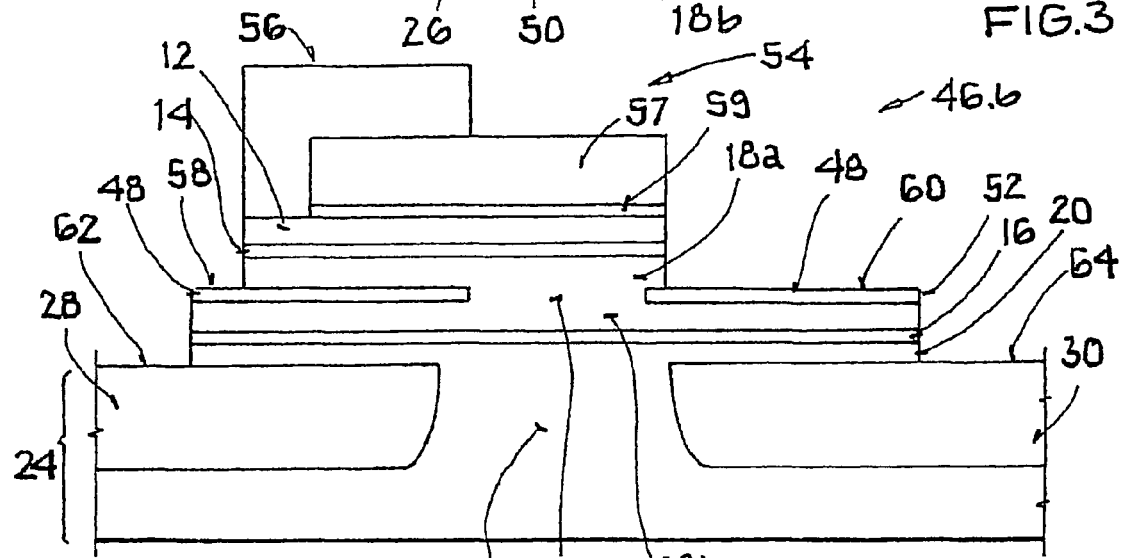
FIG. 4 illustrates the intermediate product from FIG. 3 after a first etching step.

The result of such an etching step is shown in FIG. 4. In the oxide-selective dry etching step, each of the oxide layers that is first exposed by the removal of semiconductor material functions as an etch stop layer. Consequently, a portion 58 of the dielectric layer 48 to the left of the second mask 56, and a portion 60 of the dielectric layer 48 to the right of the first mask 54, are exposed, and the removal of material outside the edges 52 of the dielectric layer proceeds down to surfaces 62, 64 of the dielectric filling of the trenches 28, 30. The structured dielectric layer 48 thus not only serves to define the vertical extent of terminal regions 51, 42, but also serves as a hard mask in an etching of the mesa structure.

Figure 5:
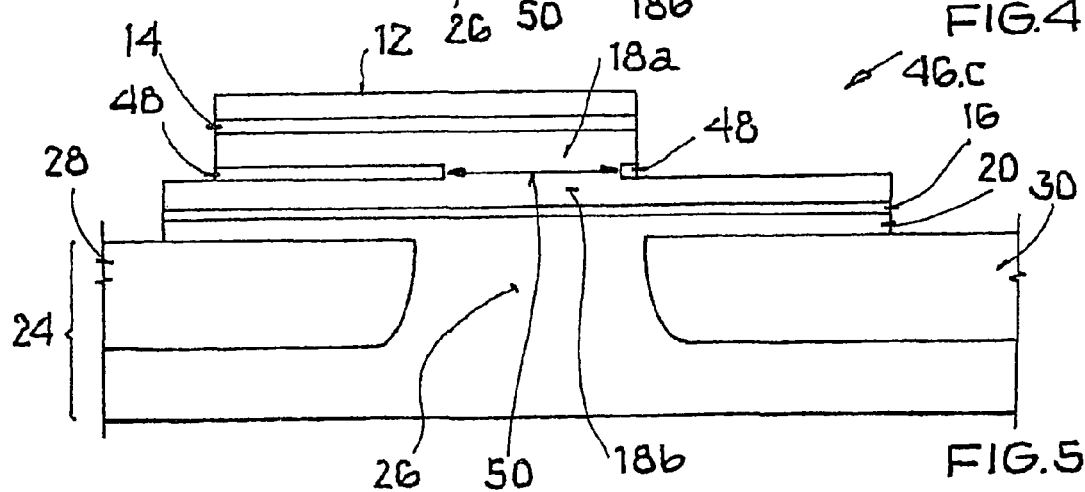
FIG. 5 illustrates the intermediate product from FIG. 4 after removal of the first and second masks and removal of excess oxide layers.

FIG. 5 shows an intermediate product 46.c based on the intermediate product 46.b from FIG. 4 after removal of the first mask 54, the second mask 56, removal of the oxide layer 59 located beneath the nitride 57 of the first mask 54, and removal of the exposed parts 58 and 60 of the dielectric layer 48.

Starting from the state shown in FIG. 5, the first terminal region 51 and second terminal region 42, each shown in FIG. 1, are produced first by implantation or diffusion of dopant atoms. There next follows an additional production of the respective low-resistance emitter contact 29, the first base contact 32, the emitter contact 38, and the second base contact 44, as they are shown in FIG. 1.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing an integrated semiconductor cascode circuit having an emitter layer, a first base region, a second base region, a collector region, and an intermediate region of a semiconductor material having a conductivity that is opposite a conductivity of the second base region, the first base region being provided between the emitter layer and the intermediate region, and the second base region being provided between the intermediate region and the collector region, the method comprising:

defining at least one dielectrically delimited active collector region in a semiconductor body;

generating, on the collector region, a layer sequence from the second base region and a second subregion of the intermediate region;

generating, on the second subregion, a dielectric layer having a central opening and an outer edge;

generating, on the dielectric layer and on a second subregion that is exposed inside the central opening and outside the outer edge, a layer sequence from the first subregion of the intermediate region and the first base region;

generating the emitter layer on the first base region;

etching a mesa structure with a first cross section by using a first mask, a second mask resting offset on one side on the first mask, and a third mask defined by the outer edge of the dielectric layer, wherein the etching removes material in the dielectric area; and increasing a dopant concentration in a first terminal region and in a second terminal region.

2. The method according to claim 1, wherein at least one of the two base regions contains SiGe.

3. The method according to claim 2, wherein the first base region and/or the second base region are SiGe layers, and the emitter layer, the intermediate region, and the collector region are Si layers.

4. The method according to claim 1, wherein the second base region, the intermediate region, the first base region, and the emitter layer are formed by epitaxial growth.

5. The method according to claim 1, wherein a defining of dielectrically delimited active collector regions in a semiconductor body is done by oxide-filled trenches.

6. The method according to claim 1, wherein the dielectric layer is generated by forming an oxide layer, and wherein the etching of the mesa structure takes place through a dry etching step that is selective to oxide.

7. The method according to claim 1, wherein the dielectric layer is an oxide layer and serves as an etch stop layer.

8. The method according to claim 1, wherein a vertical expansion of the layer stack is formed of the emitter layer, the first base region, the intermediate region, the dielectric layer, and the second base region, and is smaller than 30 nm.

9. The method according to claim 1, wherein a contact of the first base region is arranged on a first side of the layer stack, and wherein a contact of the second base region is arranged on a second side of the layer stack.

10. The method according to claim 1, wherein a first terminal region forms the electrical connection of the first base region, and a second terminal region forms the electrical connection to the second base region, wherein, in the first terminal region and in the second terminal region, an increased dopant concentration is provided the adjacent material of the emitter layer.

11. The method according to claim 1, wherein the dielectric layer is made of oxide and/or nitride.

* * * * *